(12) United States Patent
Venugopalan et al.

(10) Patent No.: US 7,358,539 B2
(45) Date of Patent: Apr. 15, 2008

(54) FLIP-CHIP LIGHT EMITTING DIODE WITH INDIUM-TIN-OXIDE BASED REFLECTING CONTACTS

(75) Inventors: Hari S. Venugopalan, Somerset, NJ (US); Ivan Eliashevich, Maplewood, NJ (US)

(73) Assignee: Lumination LLC, Valley View, OH (US)

( * ) Notice: Subject to any disclaimer, the term of this patent is extended or adjusted under 35 U.S.C. 154(b) by 612 days.

(21) Appl. No.: 10/249,436

(22) Filed: Apr. 9, 2003

(65) Prior Publication Data

US 2004/0201110 A1   Oct. 14, 2004

(51) Int. Cl.
*H01L 29/22* (2006.01)
*H01L 29/227* (2006.01)
*H01L 33/00* (2006.01)
*H01L 23/48* (2006.01)

(52) U.S. Cl. ............ 257/98; 257/99; 257/778; 257/103; 257/432; 257/E25.032

(58) Field of Classification Search ............ 257/12, 257/13, 79, 94, 95, 96, 98, 99, 103, 436, 257/778, 432, E25.032
See application file for complete search history.

(56) References Cited

U.S. PATENT DOCUMENTS

| | | | |
|---|---|---|---|
| 5,369,289 A | 11/1994 | Tamaki et al. | 257/99 |
| 5,975,408 A * | 11/1999 | Goossen | 228/173.2 |
| 6,078,064 A | 6/2000 | Ming-Jiunn et al. | 257/103 |
| 6,287,947 B1 * | 9/2001 | Ludowise et al. | 438/606 |
| 6,380,564 B1 | 4/2002 | Chen et al. | 257/99 |
| 6,573,537 B1 * | 6/2003 | Steigerwald et al. | 257/103 |
| 6,580,099 B2 * | 6/2003 | Nakamura et al. | 257/103 |
| 6,642,549 B2 * | 11/2003 | Chen et al. | 257/99 |
| 6,645,785 B2 * | 11/2003 | Koike et al. | 438/47 |
| 6,791,119 B2 * | 9/2004 | Slater et al. | 257/99 |
| 2002/0179918 A1 * | 12/2002 | Sung et al. | 257/99 |

OTHER PUBLICATIONS

Karola Thiele, Jorg Hoffman, Sibylle Sievers, and Herbert C. Freyhardt, "Growth of ITO Thin Films by Ion Beam Assisted Depositions," (abstract) Deutsche Physikal. Gesellschaft DS 22.1 (2001).*

N. Balasubramanian and A. Subrahmanyam, "Electrical and Optical Properties of Reactively Evaporated Indium tin Oxide (ITO) Films—Dependence on Substrate Temperature and Tin Concentration," Journ. Physics D: Applied Physics 22,(1989), pp. 206-209.*

* cited by examiner

*Primary Examiner*—Nitin Parekh
(74) *Attorney, Agent, or Firm*—Fay Sharpe LLP

(57) ABSTRACT

A flip chip light emitting diode die (12) includes a light-transmissive substrate (20) and a plurality of semiconductor layers (22) are disposed on the light-transmissive substrate (20). The semiconductor layers (22) define a light-generating p/n junction. An electrode (30) is formed on the semiconductor layers (22) for flip-chip bonding the diode die (12) to an associated mount (14). The electrode (30) includes an optically transparent layer (42) formed of a substantially optically transparent material adjacent to the semiconductor layers (22) that makes ohmic contact therewith, and a reflective layer (44) adjacent to the optically transparent layer (42) and in electrically conductive communication therewith.

22 Claims, 2 Drawing Sheets

FLIP-CHIP LIGHT EMITTING DIODE WITH INDIUM-TIN-OXIDE BASED REFLECTING CONTACTS

BACKGROUND OF INVENTION

The present invention relates to the electronics arts. It is especially relates to flip-chip bonded group III-nitride light emitting diodes for lighting applications, and will be described with particular reference thereto. However, the invention also finds application in conjunction with other types of flip-chip bonded light emitting diodes, and in die-bonding of other optoelectronic devices such as vertical cavity surface emitting lasers (VCSELs).

In the flip-chip mounting configuration, a light emitting diode with a light-transmissive substrate and front-side electrodes is bonded "face down" to bonding bumps of a mount, that is, with the epitaxial layers proximate to the mount and the light-transmissive substrate distal from the mount. The flip-chip arrangement has a number of advantages, including improved thermal heat sinking due to the proximity of the front-side active layers to the heat sinking substrate, and minimization of electrode shadowing losses. Often, a group III-nitride light emitting diode that includes active group III-nitride layers on a light-transmissive sapphire or silicon carbide substrate is flip-chip bonded.

For group III-nitride light emitting diodes, nickel/aluminum (Ni/Al) and nickel/silver (Ni/Ag) reflecting electrodes are known for contacting the p-type side of the diode. However, both these electrodes have problems. Ni/Al electrodes exhibit poor temperature stability, with substantial degradation of reflectivity at temperatures above 250° C. Hence, Ni/Al electrodes are not stable at temperatures typically used in soldering or otherwise flip-chip bonding the light emitting diode. Ni/Ag electrodes show better temperature stability. However, the silver of the Ni/Ag electrodes tends to migrate laterally with use over time. Migrating silver that reaches a sidewall of the device mesa produces an electrical shunting path that degrades device performance and can even produce catastrophic device shorting.

For group III-nitride light emitting diodes, nickel/aluminum (Ni/Al) and nickel/silver (Ni/Ag) reflecting electrodes for are known for contacting the p-type side of the diode. However, both these electrodes have problems. Ni/Al electrodes exhibit poor temperature stability, with substantial degradation of reflectivity at temperatures above 250° C. Hence, Ni/Al electrodes are not stable at temperatures typically used in soldering or otherwise flip-chip bonding the light emitting diode. Ni/Ag electrodes show better temperature stability. However, the silver of the Ni/Ag electrodes tends to migrate laterally with use over time. Migrating silver that reaches a sidewall of the device mesa produces an electrical shunting path that degrades device performance and can even produce catastrophic device shorting.

The present invention contemplates an improved apparatus and method that overcomes the above-mentioned limitations and others.

SUMMARY OF INVENTION

According to one embodiment, a flip chip light emitting diode die is disclosed, including a light-transmissive substrate and a plurality of semiconductor layers disposed on the light-transmissive substrate. The semiconductor layers define a light-generating p/n junction. An electrode is formed on the semiconductor layers for flip-chip bonding the diode die to an associated mount. The electrode includes an optically transparent layer formed of a substantially optically transparent material adjacent to the semiconductor layers that makes ohmic contact therewith, and a reflective layer adjacent to the optically transparent layer and in electrically conductive communication therewith.

According to another embodiment, a method is provided for producing a light output. Light is generated in active layers of a light emitting diode. A direct portion of the generated light is transmitted through a light-transmissive substrate of the light emitting diode to contribute to the light output. An indirect portion of the generated light is transmitted through an optically transparent layer of a p-type electrode of the light emitting diode. The optically transparent layer is formed of a light-transmissive material. The transmitted indirect portion of the generated light is reflected off a reflective layer of the p-type electrode of the light emitting diode. The transmitted and reflected indirect portion of the generated light is transmitted through the light-transmissive substrate of the light emitting diode to contribute to the light output.

According to yet another embodiment, a flip chip light emitting diode die is disclosed, including a light-transmissive substrate and a plurality of semiconductor layers disposed on the light-transmissive substrate. The semiconductor layers define a light-generating p/n junction. An electrode is formed on the semiconductor layers for flip-chip bonding the diode die to an associated mount. The electrode includes a degenerately doped wide bandgap semiconductor layer adjacent to the semiconductor layers that makes ohmic contact therewith, and a reflective layer adjacent to the degenerately doped wide bandgap semiconductor layer and in electrically conductive communication therewith.

According to still yet another embodiment, a flip chip light emitting diode die is disclosed, including a light-transmissive substrate and a plurality of semiconductor layers disposed on the light-transmissive substrate. The semiconductor layers define a light-generating p/n junction. An electrode is formed on the semiconductor layers for flip-chip bonding the diode die to an associated mount. The electrode includes a metal oxide layer adjacent to the semiconductor layers that makes ohmic contact therewith, and a reflective layer adjacent to the metal oxide layer and in electrically conductive communication therewith.

Numerous advantages and benefits of the present invention will become apparent to those of ordinary skill in the art upon reading and understanding the following detailed description.

BRIEF DESCRIPTION OF DRAWINGS

The invention may take form in various components and arrangements of components, and in various process operations and arrangements of process operations. The drawings are only for purposes of illustrating preferred embodiments and are not to be construed as limiting the invention. The layer thicknesses are not drawn to scale.

DETAILED DESCRIPTION

Figure 1:
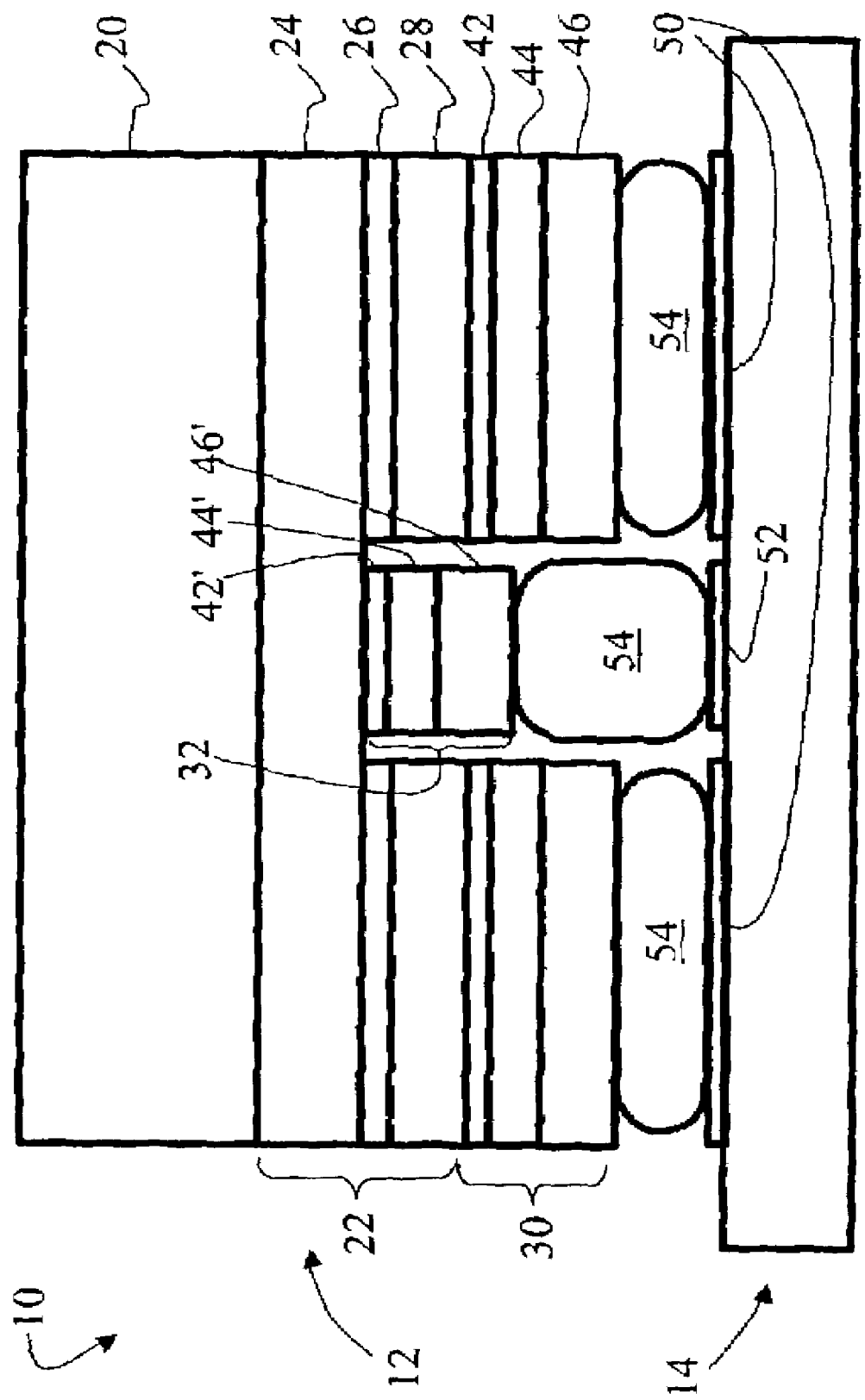
FIG. 1 shows a cross-sectional view of a flip chip group III-nitride light emitting diode.

With reference to FIG. 1, a flip-chip light emitting diode device 10 includes a light emitting diode die 12 mounted in flip chip fashion to a mount 14. The light emitting diode die 12 includes a light-transmissive substrate 20, which in a preferred embodiment is a substantially transparent sapphire or silicon carbide substrate. A plurality of semiconductor layers 22 are formed on the light-transmissive substrate 20 by metalorganic chemical vapor deposition (also referred to as organometallic vapor phase epitaxy and similar nomenclatures), molecular beam epitaxy, chemical beam epitaxy, or another epitaxial film deposition technique. In a preferred embodiment, the semiconductor layers 22 are selected group III-nitride layers such as GaN layers, AlN layers, InN layers, and ternary and quaternary alloys thereof.

The semiconductor layers 22 define a light generating p/n junction that emits light when suitably electrically energized. In one specific embodiment, the semiconductor layers 22 include an n-type GaN layer 24, an active region 26, and a p-type GaN layer 28. The active region 26 is disposed at the p/n junction and can include a single layer of InN, GaN, $In_x Ga_{1-x} N$ (0<x<1) or the like, or the active region 26 can include a plurality of layers defining, for example, a multiple quantum well or superlattice active region. In some embodiments the active region 26 may be omitted. A group III-nitride-based structure typically emits light in the blue to ultraviolet spectral range, with the specific emission spectrum dependent upon the layer compositions, thicknesses, presence of certain impurities, and other features. Optionally, the semiconductor layers 22 include additional layers, such as $Al_x Ga_{1-x} N$ cladding layers, a current-spreading layer, a buffer layer for promoting epitaxial growth, or the like. Those skilled in the art can readily select semiconductor layer thicknesses, materials, layer sequences, dopants and doping levels, and the like that are adapted for specific light emission applications. For example, group III-phosphide materials and group III-arsenide materials emit light in the visible to near infrared spectrum.

The semiconductor layers 22 are lithographically processed to remove portions of the active region 26 and the p-type GaN 28 to define device mesas. At least one electrode 30 is formed on the p-type GaN layer 28 atop the mesa, and at least one electrode 32 is formed on the n-GaN layer 24 where it is exposed by the lithographic processing. The p-type electrode or p-electrode 30 is preferably a three-layer stack, including a degenerately doped wide bandgap semiconductor layer 42, a reflective layer 44, and a bonding layer 46.

The degenerately doped wide bandgap semiconductor layer 42 has a bandgap that is larger than photon energies of light produced by the light emissive semiconductor layers 22. In a suitable embodiment, the degenerately doped wide bandgap semiconductor layer 42 is a metal oxide such as an oxide of indium, tin, zinc, cadmium, or the like, or alloys thereof. In a preferred embodiment, the degenerately doped wide bandgap semiconductor layer 42 is indium tin oxide (ITO). It will be appreciated that a degenerately doped wide bandgap semiconductor layer 42 such as ITO with a bandgap substantially greater than the photon energy of light produced by the light emissive semiconductor layers 22 is substantially transparent to the emitted light. That is, the material that forms the layer 42 is substantially transparent. For group III-nitride semiconductor layers 22, a degenerately doped wide bandgap semiconductor material with a bandgap of about 3.5 eV or higher is substantially transparent for light generated by the group III-nitride layers 22.

The transparent ITO or other degenerately doped wide bandgap semiconductor layer 42 is distinguished from light-transmissive thin metal films such as are sometimes used for current spreading layers in light emitting devices. Thin metal current-spreading films are substantially light-transmissive due to their extreme thinness (typically a few nanometers thick at the most). However, these thin layers are not formed of a substantially transparent material. Rather, the metal is highly absorbing, and optical transparency is achieved by extreme thinness of the layer. For example, a nickel or gold current-spreading layer is usually less than or about 2-3 nanometers thick to provide 90% single-pass light transmittance. In contrast, the transparent ITO or other degenerately doped wide bandgap semiconductor layer 42 is at least 5 nanometers thick, and preferably a few tens to a few hundreds of nanometers thick. In general, a thicker ITO film is advantageously repeatable in production from run-to-run in terms of thickness.

The reflective layer 44 is preferably aluminum or silver, and is preferably greater than 50 nanometers thick to realize bulk reflectivity of the metal. In view of silver migration problems that have been observed in the past, aluminum may be preferable from a device reliability standpoint. Other materials that form a reflective interface with the degenerately doped wide bandgap semiconductor layer 42 can also be used. Moreover, the reflective layer 44 can be a multi-layer Bragg reflector. The bonding layer 46 is preferably a gold layer, although other solderable or otherwise bondable materials can be employed. Moreover, if the reflective layer 44 is a bondable material, then the separate bonding layer 46 is optionally omitted, and the p-type electrode reduces to a two-layer stack. Similarly, the bonding layer can include more than one layer designed to provide reliable bonding.

In the embodiment of FIG. 1, the n-type electrode or n-electrode 32 is also a three-layer stack of a degenerately doped wide bandgap semiconductor layer 42', a reflective layer 44', and a bonding layer 46'. Optionally, the layers 42', 44', 46' of the n-type electrode 32 are the same as the layers 42, 44, 46 of the p-type electrode 30. This arrangement has the benefit that the two electrodes 30, 32 can be formed at the same time in common layer deposition processes. Alternatively, the n-type electrode can employ a different stack that is optimized to make electrical contact with the n-type layer 24. In the p-on-n diode configuration of the light emitting diode die 12 of FIG. 1, light is generated in the p-type mesa, and so the reflectivity of the n-type electrode is less important for light collection.

The light emitting diode die 12 is mounted in flip chip fashion on bonding pads 50, 52 of the mount 14 using bonding bumps 54. In one suitable embodiment, the bonding bumps are copper bumps, and the electrodes 30, 32 are bonded by thermosonic bonding to the copper bumps. In another suitable embodiment, the bonding bumps are solder bumps and the electrodes 30, 32 are soldered to the mount 14. The mount 14 can be a sub-mount, a printed circuit board, or the like, and preferably provides heat sinking through the electrodes 30, 32, the bonding bumps 54, and bonding pads 50, 52.

In operation, the light emitting diode die 12 is electrically energized, for example forward-biased, via the electrodes 30, 32. The energizing creates an electrical current. Light is generated in the active region 28 by electron-hole recombination. Some of the generated light is generally directed toward the light-transmissive substrate 20, and passes therethrough to contribute to light output.

Some of the generated light is generally directed toward the p-type electrode or electrodes 30. This light passes through the degenerately doped wide bandgap semiconductor layer 42, which is substantially optically transparent to the light. At an interface between the degenerately doped wide bandgap semiconductor layer 42 and the reflective layer 44 the light is reflected back generally toward the substrate 20, passes back through the optically transparent degenerately doped wide bandgap semiconductor layer 42, enters the light-transmissive substrate 20, and passes therethrough to provide an additional contribution to the light output.

Those skilled in the art will appreciate that the optically transparent degenerately doped wide bandgap semiconductor layer 42 beneficially decouples the issue of forming good ohmic contact between the p-type layer 28 and the p-type electrode 30, on the one hand, from the issue of forming a highly reflective p-type electrode 30 on the other hand. The p-type electrode of a flip-chip light emitting diode should provide both good ohmic contact and high reflectivity. In the past, material selection for interfacing with the p-type layer involved an undesirable compromise between these competing interests.

Figure 2:
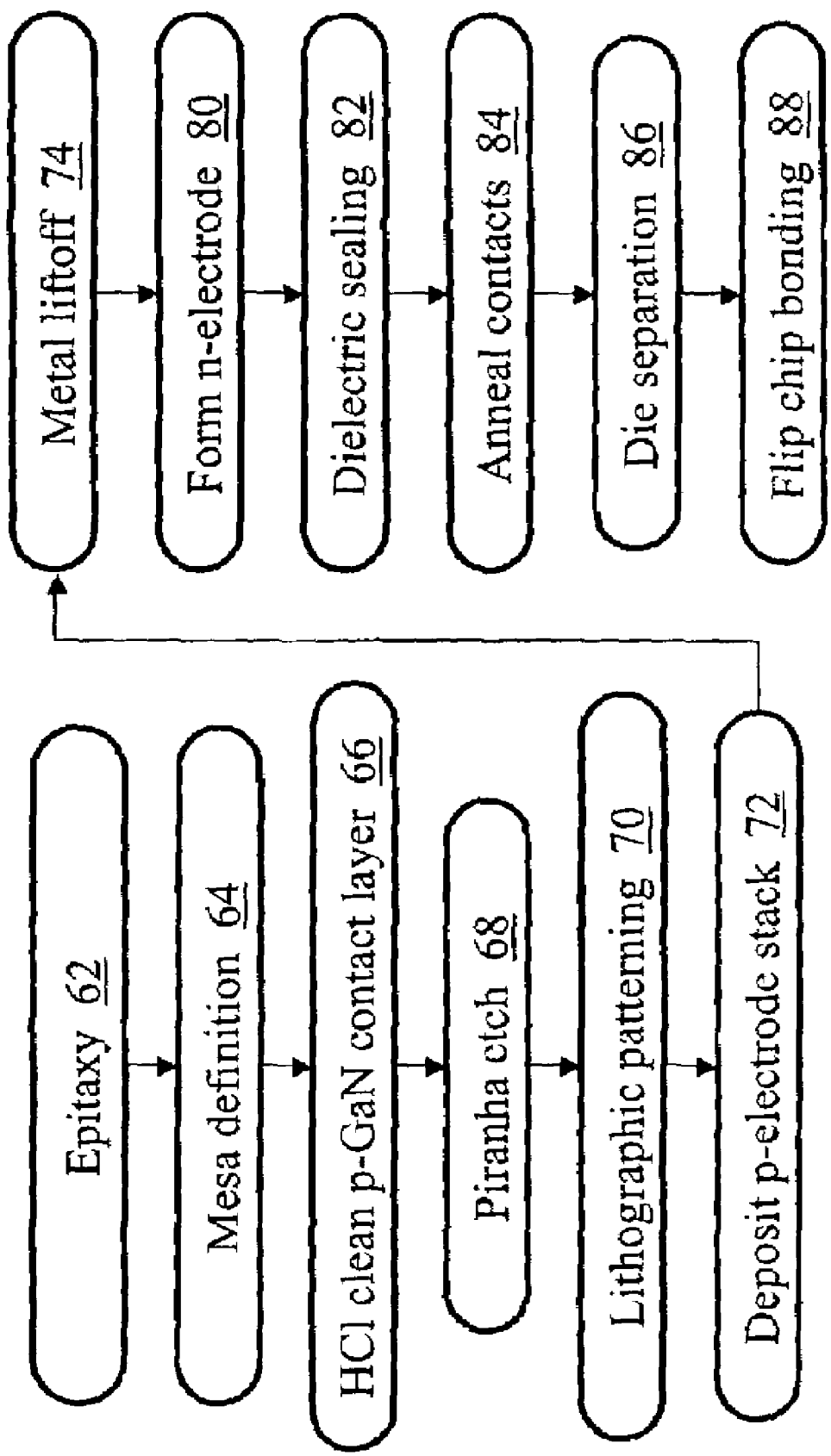
FIG. 2 shows a preferred method for fabricating a flip chip group III-nitride light emitting diode.

With reference to FIG. 2, a suitable method 60 for fabricating the flip-chip light emitting diode device 10 of FIG. 1 begins with the substrate 20. The nitride layers 22 are formed 62, preferably by metalorganic chemical vapor deposition, molecular beam epitaxy, or the like, followed by lithographic etching process 64 that defines the device mesas. Preparatory to formation of the electrodes 30, 32, the surface including the p-contact areas is cleaned 66 with hydrochloric acid (HCl), followed by a piranha etch 68 (a mixture of sulfuric acid ($H_2SO_4$) and hydrogen peroxide ($H_2O_2$)) to remove organic or other contaminants.

The p-electrode 30 is formed using lithographic patterning 70 that defines resist windows corresponding to p-electrode 30. The metal layers 42, 44, 46 of the p-type electrode 30 are deposited 72. In a preferred embodiment, a liftoff lithographic process is used in which the resist includes openings corresponding to the p-electrode or electrodes 30. The metal layers 42, 44, 46 overcoat both the exposed areas and the resist. After metal deposition, the metal in areas outside the lateral areas of the p-electrodes 30 is removed by liftoff 74, that is, the resist is removed in a suitable solvent which effects liftoff of the overcoating metal, leaving the metallization only on the p-electrode or p-electrodes 30.

The lithographic metallization process 70, 72, 74 is preferred, because liftoff is well-suited for patterning thick metal layers. However, other lithographic metallization processes can be used. For example, the metal layers can be deposited first, followed by lithographic patterning that protects the metal in the lateral areas of the p-electrodes 30. The unprotected metal is then removed by wet- or dry-etching, and the resist stripped away.

The n-electrode 32 is formed in a lithographic metallization process 80. In the exemplary embodiment in which the layers 42', 44', 46' of the n-type electrode 32 are the same as the layers 42, 44, 46 of the p-type electrode 30, the metallization process 80 is not separate from the lithographic metallization process 70, 72, 74. Rather, the lithographic metallization process 70, 72, 74 forms both the n-electrode 32 and the p-electrode 30 simultaneously. On the other hand, if one or more of the layers 42', 44', 46' of the n-type electrode 32 are different from the layers 42, 44, 46 of the p-type electrode 30, then a separate lithographic metallization process 80 is suitably performed. In such a case, either the p-electrode 30 is formed first followed by formation of the n-electrode 32, as shown in the method 60, or the n-electrode 32 can be formed first followed by formation of the p-electrode 30.

To improve device reliability, the light emitting diode die 12 is preferably encapsulated in a dielectric sealant process 82. Of course, the dielectric sealing 82 should leave at least portions of the electrodes 30, 32 exposed. The device is then suitably annealed 84. An anneal at about 250° C. has been found to provide good ohmic contact between the p-GaN layer 28 and the indium tin oxide layer 42 of the p-electrode 30. Those skilled in the art can readily optimize annealing parameters for specific p-type layers, doping levels, and substantially transparent electrode layer characteristics. Using the 250° C. anneal, good ohmic contact between ITO and p-GaN has been obtained for p-GaN layers doped less than $5 \times 10^{18}$ cm$^{-3}$, and has further been obtained for p-GaN layers having layer thicknesses greater than 50 nanometers.

For mass production, the deposition 62 of the nitride layers 22, mesa formation 64, the processing 66, 68, 70, 72, 74, 80 to form the electrodes 30, 32, the dielectric sealing 82, and the annealing 84 are preferably performed as wafer-level processes applied to the transparent substrate 20 in wafer form to produce a large number of light emitting diode dice 12 on the wafer. The substrate wafer is then diced 86 to separate the individual light emitting diode dice, and the light emitting diode die 12 is flip chip bonded 88 to the mount 74. The bonding 88 is preferably thermosonic bonding; however, soldering can be used instead.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A flip chip light emitting diode including:
   a light-transmissive substrate;
   a plurality of semiconductor layers disposed on the light-transmissive substrate, the semiconductor layers defining a light-generating p/n junction; and
   a reflective electrode formed on the semiconductor layers for flip-chip bonding the diode to an associated mount, the electrode including an optically transparent layer formed of substantially optically transparent indium tin oxide adjacent to a group III-nitride semiconductor layer of the plurality of semiconductor layers and making ohmic contact therewith, and a reflective layer adjacent to the optically transparent layer and in electrically conductive communication therewith.

2. The flip chip light emitting diode as set forth in claim 1, wherein the optically transparent layer formed of indium tin oxide has a thickness of between a few tens and a few hundreds of nanometers.

3. The flip chip light emitting diode as set forth in claim 1, wherein the reflective layer is selected from a group consisting of a silver layer and an aluminum layer.

4. The flip chip light emitting diode as set forth in claim 1, wherein the electrode further includes:
   a bonding layer adjacent to the reflective layer.

5. The flip chip light emitting diode as set forth in claim 4, wherein the bonding layer includes a gold layer.

6. The flip chip light emitting diode as set forth in claim 4, wherein the bonding layer includes a titanium/nickel/gold metal stack.

7. The flip chip light emitting diode as set forth in claim 1, wherein the electrode contacts a p-type group III-nitride semiconductor layer that has a hole concentration less than or equal to $5 \times 10^{18}$ cm$^{-3}$.

8. The flip chip light emitting diode as set forth in claim 1, wherein the electrode contacts a p-type group III-nitride semiconductor layer that has a thickness of at least 50 nanometers.

9. A flip chip light emitting diode including:
a light-transmissive substrate;
a plurality of semiconductor layers disposed on the light-transmissive substrate, the semiconductor layers defining a light-generating p/n junction; and
a reflective electrode formed on the semiconductor layers for flip-chip bonding the diode to an associated mount, the electrode including a light-transmissive degenerately doped wide bandgap semiconductor layer having a bandgap larger than photon energies of light produced by the plurality of semiconductor layers and having a thickness of between a few tens and a few hundreds of nanometers, the degenerately doped wide bandgap semiconductor layer being adjacent to a group III-nitride semiconductor layer of the plurality of semiconductor layers and making ohmic contact therewith, and a reflective layer adjacent to the degenerately doped wide bandgap semiconductor layer and in electrically conductive communication therewith, wherein light travels through the light transmissive layer, reflects from the reflective layer and escapes the light emitting diode through the light-transmissive substrate.

10. The flip chip light emitting diode as set forth in claim 9, wherein the degenerately doped wide bandgap semiconductor layer has a bandgap of at least 3.5 eV.

11. The flip chip light emitting diode as set forth in claim 9, wherein the degenerately doped wide bandgap semiconductor layer includes an indium tin oxide layer.

12. The flip chip light emitting diode as set forth in claim 11, wherein the electrode contacts a p-type group III-nitride semiconductor layer that has a hole concentration less than or equal to $5 \times 10^{18}$ cm$^{-3}$.

13. The flip chip light emitting diode as set forth in claim 11, wherein the electrode contacts a p-type group III-nitride semiconductor layer that has a thickness of at least 50 nanometers.

14. The flip chip light emitting diode as set forth in claim 9, wherein the degenerately doped wide bandgap semiconductor layer includes a degenerately doped metal oxide.

15. The flip chip light emitting diode as set forth in claim 9, wherein the reflective layer is selected from a group consisting of a silver layer and an aluminum layer.

16. The flip chip light emitting diode as set forth in claim 9, wherein the electrode further includes:
a bonding layer adjacent to the reflective layer and bonded to the second bonding pad.

17. The flip chip light emitting diode as set forth in claim 16, wherein the bonding layer includes a gold layer.

18. A light emitting device including:
a light emitting diode die including a plurality of semiconductor layers defining a light-generating p/n junction, the plurality of semiconductor layers including a group III-nitride semiconductor layer; and
a reflective electrode including a substantially optically transparent degenerately doped wide bandgap semiconductor layer disposed on the group III-nitride semiconductor layer and making ohmic contact therewith, and a reflective layer disposed on the degenerately doped wide bandgap semiconductor layer and in electrically conductive communication therewith.

19. The light emitting device as set forth in claim 18, wherein the degenerately doped wide bandgap semiconductor layer includes an indium tin oxide layer.

20. The light emitting device as set forth in claim 19, wherein the group III-nitride semiconductor layer is a p-type layer in ohmic contact with the indium tin oxide layer.

21. The light emitting device as set forth in claim 19, wherein the group III-nitride semiconductor layer is a p-type layer in ohmic contact with the indium tin oxide layer and has at least one of (i) a hole concentration less than or equal to $5 \times 10^{18}$ cm$^{-3}$, and (ii) a thickness of at least 50 nanometers.

22. The light emitting device as set forth in claim 18, wherein the light emitting diode die and the reflective electrode define are configured for flip chip bonding via at least the reflective electrode to an associated support.

* * * * *